United States Patent
Hisch

(10) Patent No.: US 8,508,397 B2
(45) Date of Patent: Aug. 13, 2013

(54) DEVICE FOR THE ANALOG/DIGITAL CONVERSION OF SIGNALS IN A LARGE DYNAMIC RANGE

(75) Inventor: Martin Hisch, Forstinning (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 63 days.

(21) Appl. No.: 13/256,069

(22) PCT Filed: Feb. 11, 2010

(86) PCT No.: PCT/EP2010/000859
§ 371 (c)(1),
(2), (4) Date: Sep. 12, 2011

(87) PCT Pub. No.: WO2010/102703
PCT Pub. Date: Sep. 16, 2010

(65) Prior Publication Data
US 2012/0001786 A1 Jan. 5, 2012

(30) Foreign Application Priority Data
Mar. 11, 2009 (DE) .......................... 10 2009 012 562

(51) Int. Cl.
*H03M 1/12* (2006.01)
(52) U.S. Cl.
USPC .......................................... 341/155; 341/159
(58) Field of Classification Search
USPC .......................................... 341/155, 158, 159
See application file for complete search history.

(56) References Cited

U.S. PATENT DOCUMENTS

| | | | | |
|---|---|---|---|---|
| 5,473,702 A | * | 12/1995 | Yoshida et al. | 381/94.7 |
| 6,940,973 B1 | * | 9/2005 | Yeap et al. | 379/416 |
| 7,053,804 B1 | | 5/2006 | Nairn | |
| 7,091,894 B2 | * | 8/2006 | Fudge et al. | 341/155 |
| 7,289,053 B2 | * | 10/2007 | Bunin | 341/156 |
| 7,466,251 B2 | * | 12/2008 | Uchino | 341/120 |

FOREIGN PATENT DOCUMENTS

EP 0 351 788 A2 1/1990

OTHER PUBLICATIONS

International Search Report for corresponding PCT Application No. PCT/EP2010/000859, Sep. 3, 2010, pp. 1-4.
International Preliminary Report on Patentability for PCT Application No. PCT/EP2010/000859 dated Sep. 15, 2011, pp. 1-8.

* cited by examiner

*Primary Examiner* — Brian Young
(74) *Attorney, Agent, or Firm* — Ditthavong Mori & Steiner, P.C.

(57) ABSTRACT

A device for expanding the dynamic range of a broadband analog/digital converter is provided. The device comprises a splitter module configured to split an analog input signal into a first analog signal output on a first signal branch, and a second analog signal output on a second signal branch. The device further comprises a first analog/digital converter configured to digitize the first analog signal into a first digital signal, a second analog/digital converter configured to digitize the second analog signal into a second digital signal, and a first switching module configured to switch one of the first signal branch and the second signal branch to an output of the apparatus. The device further comprises a first regulating module, disposed between the second analog/digital converter and the first switching module, wherein the first regulating module is configured to adaptively match amplitudes of the second digital signal to amplitudes of the first digital signal.

20 Claims, 2 Drawing Sheets

DEVICE FOR THE ANALOG/DIGITAL CONVERSION OF SIGNALS IN A LARGE DYNAMIC RANGE

CROSS-REFERENCE TO RELATED APPLICATIONS

The present application is a national phase application of PCT Application No. PCT/EP2010/000859, filed on Feb. 11, 2010, and claims priority to German Patent Application No. DE 10 2009 012 562.0, filed on Mar. 11, 2009, the entire contents of which are incorporated herein by reference.

BACKGROUND OF THE INVENTION

1. Field of the Invention

The invention relates to a device for expanding the dynamic range of a broadband analog/digital converter.

2. Discussion of the Background

The use of broadband analog/digital converters has made possible the development of modern broadband communication methods. However, the demands on the dynamics of the analog/digital converter, for example, in the reception device, have also increased together with the bandwidth of the communications method. The prior art resolves the dynamics problem by means of a pre-amplifier with a variable amplification factor and a downstream analog/digital converter. In this context, a regulating algorithm ensures a matched adjustment of the amplification factor, and, in this case, the actual level control is often derived from the digital sampled values.

However, a method of this kind is subject to a series of disadvantages. The variation of the analog amplification causes interference impulses. For amplitude-sensitive applications, the allocation of the digital signal sampled values for corresponding analog amplification is very important and can be realized only with great difficulty because of the variation of the analog amplification, if this is possible at all. Interference impulses lead to a short term overdrive of the analog/digital converter and, after the regulating procedure, lead to a reduction in sensitivity for an adjustable holding time. After every regulating procedure, the entire subsequent signal train, of the analog and also the digital part, must settle again, which, under some circumstances, leads to a significant reduction in the measurement rate.

The published international application no. WO 03/009478 A3 discloses an alternative dynamic expansion of analog/digital converters. An analog signal splitter splits the signal to be converted into N signal components. In every signal branch, an independent dither signal, which is subsequently removed again, is added to the signal, and the signal is then digitized by an analog/digital converter. The digital sampled values of every signal branch pass through an equalizer, which removes the errors in phase and amplitude. All channels are summated and equalized again. The disadvantage with this method is that, with every doubling of the number of analog/digital converters, exactly 3 dB of dynamic improvement is achieved. Accordingly, in order to achieve a dynamic improvement of 12 dB, 16 analog/digital converters are required. This is uneconomical and demands high precision in matching the many signal branches with one another. In the case of wide broadband applications, problems in the removal of the dither signal can occur in some circumstances, because a simple filtering is not possible in view of the broad bandwidth. The level of the dither signals must also be significantly higher than the level of the noise associated with the payload signal, because this noise is identical, that is to say, correlates on all channels. A calibration procedure is also required for the adjustment of the equalizers.

Therefore, there is a need for improved In order to resolve these problems of the prior art, therefore, there is a need for a simpler and more economical device for digitizing data, while providing a broad dynamic range, which generates only minimal or no interference through the dynamic expansion.

SUMMARY OF THE INVENTION

Embodiments of the invention, therefore, provide a splitting device with a first and second output, wherein the splitting device is, for example, a power splitter, which splits an analog input signal into a first output signal capable of being output to the first output of a first signal branch with a first power fraction, and a second analog signal capable of being output to a second output of a second signal branch with a second power fraction. According to further embodiments of the invention, the first and the second output of the power splitter are each connected to a first and second analog/digital converter, so that the first and second analog signal can each be digitized. A switching device connects either the first or the second signal branch to a signal output. A regulating device is arranged between the second analog/digital converter and the switching device for the adaptive matching at least of the amplitudes of the second digital output signal of the second analog/digital converter to the amplitudes of the first digital output signal of the first analog/digital converter.

Through the matching of at least the amplitudes of the second signal branch to the amplitudes of the first signal branch in the regulating device, in the event of a switching from the first to the second signal branch (for example, in the case of the overdrive of the first analog/digital converter) no interference is generated as a result of different amplitudes. With an automatic matching of this kind, no calibration procedures are required.

In one example embodiment, if the switching device connects the first signal branch to the signal output, then the regulating device matches the amplitudes in an adaptive manner, and, if the switching device connects the second signal branch to the signal output, then the regulating device regulates the amplitudes of the second digital output signal according to the last matched amplitudes at the previous switching position. This prevents the amplitudes of the second signal branch from continuing to be matched to the amplitudes of the overdriven signal branch in the case of a switching to the second signal branch in the event of an overdrive of the first analog/digital converter.

In a further example embodiment, the regulating device is an adaptive filter and, for the matching of the amplitude and the phase, the filter coefficients can be matched in a cyclical manner to a reference signal applied to a reference input. Through the adaptive filter, amplitudes and also phases of the second signal branch can be matched, and a phase error during the switching from the first to the second signal branch is avoided. Furthermore, if the matching of the filter coefficients can be switched off, after the switchover from the first to the second signal branch, the filter coefficients can be fixed, without being falsified by the overdriven first signal branch.

In yet a further example embodiment, the first signal branch provides a reference connection to the regulating device between the first analog/digital converter and the switching device and that a delaying circuit is attached to the first analog/digital converter and the reference connection to the regulating device. Through the delaying circuit in the first signal branch, the processing time of the first signal branch is matched to that of the second signal branch with the additional adaptive filter, especially by taking into consideration the filter delay time. Through the delay of the reference signal for the regulating device, the matching of the amplitudes or respectively of the filter coefficients of the regulating device can be switched off in the event of an overdrive of the first analog/digital converter, and the filter coefficients can be frozen before an overdriven reference signal arrives in the regulating device.

In another example embodiment, the device according to the invention provides a control device with a signal input for the reception of a control signal which describes the overdrive of the first analog/digital converter, and with a signal output for the output of a switching signal. The signal output of the control device is advantageously connected to a control input of the switching device. Accordingly, in the event of an overdrive of the first analog/digital converter, it is possible to switch automatically from the first to the second signal branch. The signal output of the control device is also advantageously connected to a control input of the regulating device, so that the matching of the amplitudes or respectively the filter coefficients can be switched off automatically in the event of an overdrive of the first analog/digital converter.

The switching signal of the control device may be output for a minimum period after every reception of a control-signal information which corresponds to an overdriven analog/digital converter, and the minimum period restarts from the beginning after every reception of the control-signal information. Accordingly, the constant switching to and fro between the signal branches as a result of operating in the threshold range between normal and overdriven first analog/digital converter can be avoided.

In a further example embodiment, the first and the second analog/digital converter are of the same type and operate in a time-synchronous manner. This guarantees a time-synchronous sampling and avoids phase errors. The at least two analog/digital converters are connected for this purpose to a common time-base source.

In yet a further example embodiment, the first power fraction is larger than the second power fraction. As a result, the second analog/digital converter also still functions with an overdriven first analog/digital converter, and the dynamic range of the analog/digital conversion is expanded.

In further example embodiments, the first and the second signal branch each provide a digital data reducer, primarily, if this is arranged upstream of the regulating device. The matching of the amplitudes or respectively the filter coefficients is very calculation intensive and can be simplified and speeded up by a data reduction of the signals.

In a further example embodiment, at least one third signal branch is set up in the same ratio to the second signal branch as the second signal branch is to the first signal branch, wherein a regulating device of the third signal branch is suitable for the adaptive matching at least of the amplitudes of a third digital output signal of a third analog/digital converter to the amplitudes of the first digital output signal of the first analog/digital converter. With additional signal branches, the dynamic range can be expanded even further, because, if the first and also the second analog/digital converter are overdriven, a third, non-overdriven analog/digital converter is still available.

In other example embodiments, the initialization values of the regulating device can be calculated in advance either statically or dynamically with the assistance of a calibration procedure. A static calculation of the initialization values of the regulating device can be implemented simply, rapidly and without interrupting operation. A calibration allows a more precise specification dependent upon the amplitudes of the analog input signal.

BRIEF DESCRIPTION OF THE DRAWINGS

Various exemplary embodiments are illustrated by way of example, and not by way of limitation, in the figures of the accompanying drawings in which like reference numerals refer to similar elements and in which.

DETAILED DESCRIPTION OF EXEMPLARY EMBODIMENTS OF THE INVENTION

Figure 1:
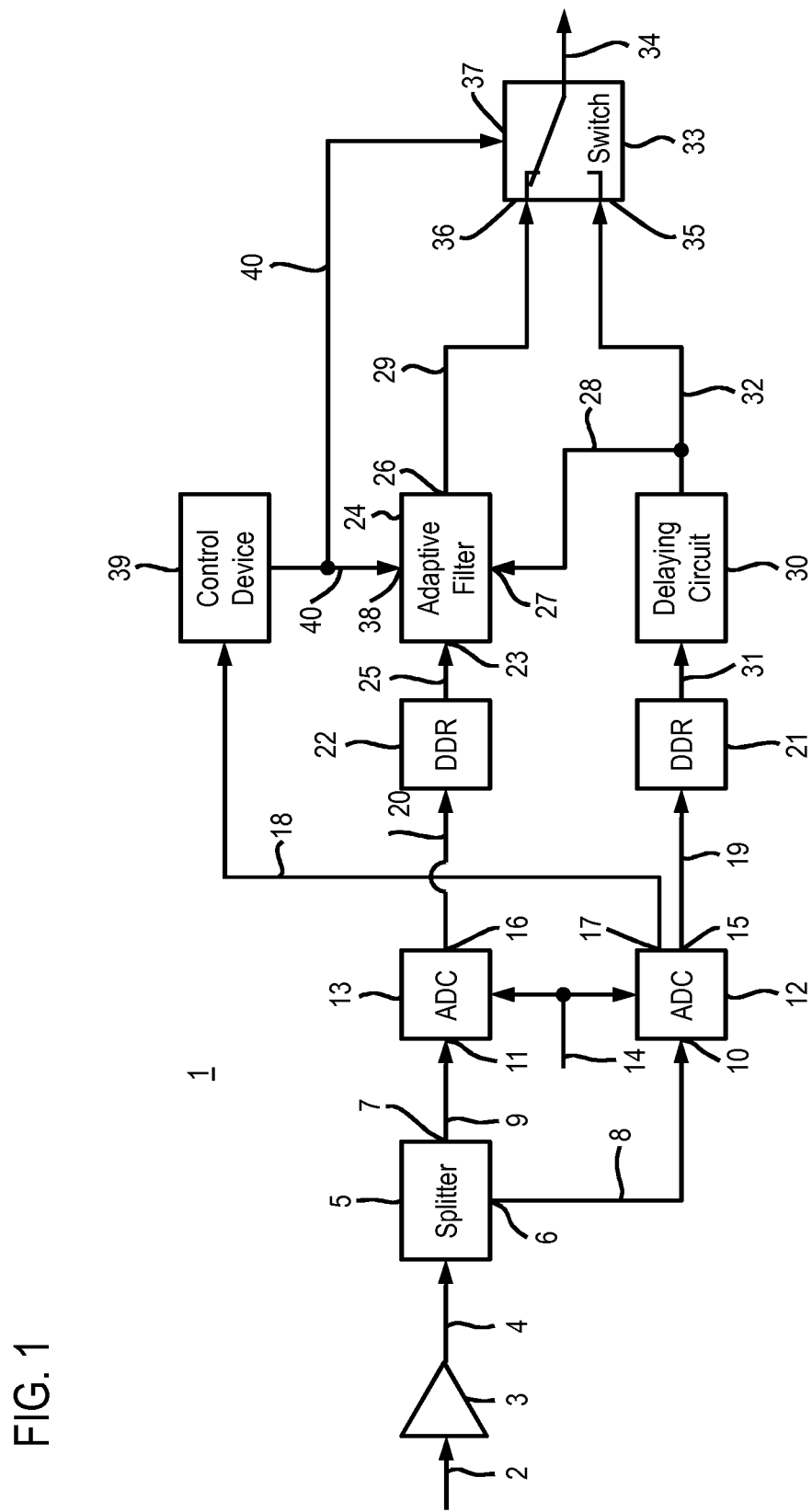
FIG. 1 shows a schematic presentation of a first exemplary embodiment of the device according to the invention for the digitization of data.

FIG. 1 shows a circuit 1 of a first exemplary embodiment of the device according to the invention for the digitization of data. An analog input signal 2 is amplified in a pre-amplifier 3 to form an amplified analog input signal 4 and supplied to a power splitter 5. The power splitter 5 provides a first and a second output 6 and 7, to which the amplified analog input signal 4 is a supplied in an attenuated manner in each case with the power fractions (n−1)/n and 1/n. With n=16, a ratio of the two power fractions of almost 12 dB is obtained. The power splitter 5 therefore outputs at the first output 6 a first analog output signal 8, which corresponds to the amplified analog input signal 4 attenuated with the power fraction (n×1)/n. Accordingly, the power splitter 5 outputs at the second output 7 a second analog output signal 9, which corresponds to the amplified analog input signal 4 attenuated with the power fraction 1/n.

The two outputs 6 and 7 of the power splitter 5 are each connected to an analog input 10 and 11 of a first or of a second analog-to-digital converter (ADC or analog/digital converter) 12 and 13. The two analog/digital converters 12 and 13 are of the same type and are synchronized by a sampling clock 14. This ensures that the two ADCs 12 and 13 receive the same signal component of the input signal 2 at the same time in each case with different attenuation at the input 10 and 12 and also digitize the analog signal values at the same time and pass them to the digital outputs 15 and 16. As a result of the fact that the two analog signals 8 and 9 have been attenuated in a different manner, the second ADC 13 can still operate normally even if the first ADC 12 is already in an overdriven condition. The first ADC 12 has a control output 17, at which a control signal 18 can be output when the first ADC 12 is in an overdriven condition.

The digital outputs 15 and 16 are each connected to an input of the first and second digital data reducer (DDR) 21 and 22. The first and the second digitized output signal 19 and 20 of the first and the second ADCs 12 and 13 are each compressed in the first and second digital data reducer 21 and 22.

The output of the second digital data reducer 22 of the second signal branch is connected to a signal input 23 of an adaptive filter 24 as the regulating device. Via this connection, the adaptive filter 24 obtains the second, reduced, digitized output signal 25. The adaptive filter 24 filters the signal 25 disposed at the signal input 23 corresponding to the current filter coefficients and outputs the filtered signal at the filter output 26. The filter coefficients are matched corresponding to a reference signal 28 disposed at a reference input 27, so that the filtered signal 29 corresponds to the reference signal 28 in phase and amplitude. The reference signal 28 is branched from the first signal branch to a delaying circuit 30. The adaptive filter 24 additionally provides another control input 38 for fixing the currently adjusted filter coefficients upon reception of a control signal at the control input 38.

The output of the first digital data reducer 21 is connected to the input of a delaying circuit 30, and the first reduced digitized output signal 31 is delayed in the delaying circuit 30 for a time which corresponds to the processing time of the adaptive filter 24, and output as a delayed signal 32 at the output of the delaying circuit 30. Since the delayed signal 32 is branched as a reference signal 28 for the adaptive filter 24, and the first reduced digitized output signal 31 is delayed corresponding to the delay time of the adaptive filter 24, the filtered signal 29 and the delayed signal 32 are identical in phase and amplitude.

Either the delayed signal 32 of the first signal branch or the filtered signal 29 of the second signal branch can now be connected to a signal output 34 via a switch 33. The switch 33 is connected with a first signal input 35 to the output of the delaying circuit and with a second signal input 36 to the filter output 26. The switch 33 additionally provides a control input 37, by means of which the two switching positions can be selected. Since the filtered signal 29 and the delayed signal 32 are identical in phase and amplitude, no interference is caused by the change from the first to the second signal branch in the event of a switching process.

The control output 17 of the first ADC 12 is connected to an input of a control device 39. On receiving a control signal 18, which signals the first ADC 12 as overdriven, the control device 39 outputs a switching signal 40 for a set time to the output of the control device 39. The output of the control device 39 is connected to the control input 38 of the adaptive filter 24 and to the control input 37 of the switch 33. If the switching device 33 receives the switching signal 40 at its control input 37, the switch 33 is switched in such a manner that the second signal branch is connected to the signal output 34. At the same time, the adaptive filter 24 receives the switching signal 40 at the control input 38 and fixes the filter coefficients in a time-constant manner in order to avoid a matching of the filter coefficients to a time characteristic of the reference signal 28 with interference from an overdriven ADC 12. Because of the delaying circuit 30, the switching signal 40 reaches the adaptive filter 24 before interference from an overdrive of the ADC 12 in the references signal 28 can influence the adaptive filter 24. Through the control device 39, a switching signal 40 is output for a given time with every reception of a control signal 18 of an overdriven ADC 12. This ensures that, after the switchover to the second signal branch, at least the given time is waited until a switch-back to the first signal branch. If a new control signal 18 of an overdriven ADC 12 is received in the intervening time, the given time starts again from the beginning. This avoids a constant switching to and fro between the first and the second signal branch in the case of an operation close to the overdrive of the ADC.

If the first ADC 12 returns to the normal operating range for a time which is longer than the given period of time, the filter coefficients of the adaptive filter 24 are again matched continuously to the reference signal after the ending of the switching signal 40.

The initialization values of the adaptive filter 24 can be calculated in advance either through static calculation or dynamically through a calibration.

The reduction of the data in the digital data reducers 21 and 22 here is not restricting for the invention. The data reduction can also be dispensed with and be implemented at another position in the two data branches or take place only at the signal output 34. However, it is particularly advantageous to decimate the data before the input of the adaptive filter 24, because the calculation of the filter coefficients with sampling rates of greater than 200 MSPS is very calculation intensive, and the calculation load of the adaptive filter can be reduced by decimating the data.

As an alternative, instead of an adaptive filter 24, a simple amplitude regulation can be used. This is relevant primarily for phase-uncritical applications, because an amplitude regulation can be realized more favorably and with lower cost than an adaptive filter 24.

The control signal 18 need not be output from the ADC 12, a digital comparator which outputs a control signal 18 in the event of an exceeding of a threshold, can be placed in the digital part of the first signal branch.

Figure 2:
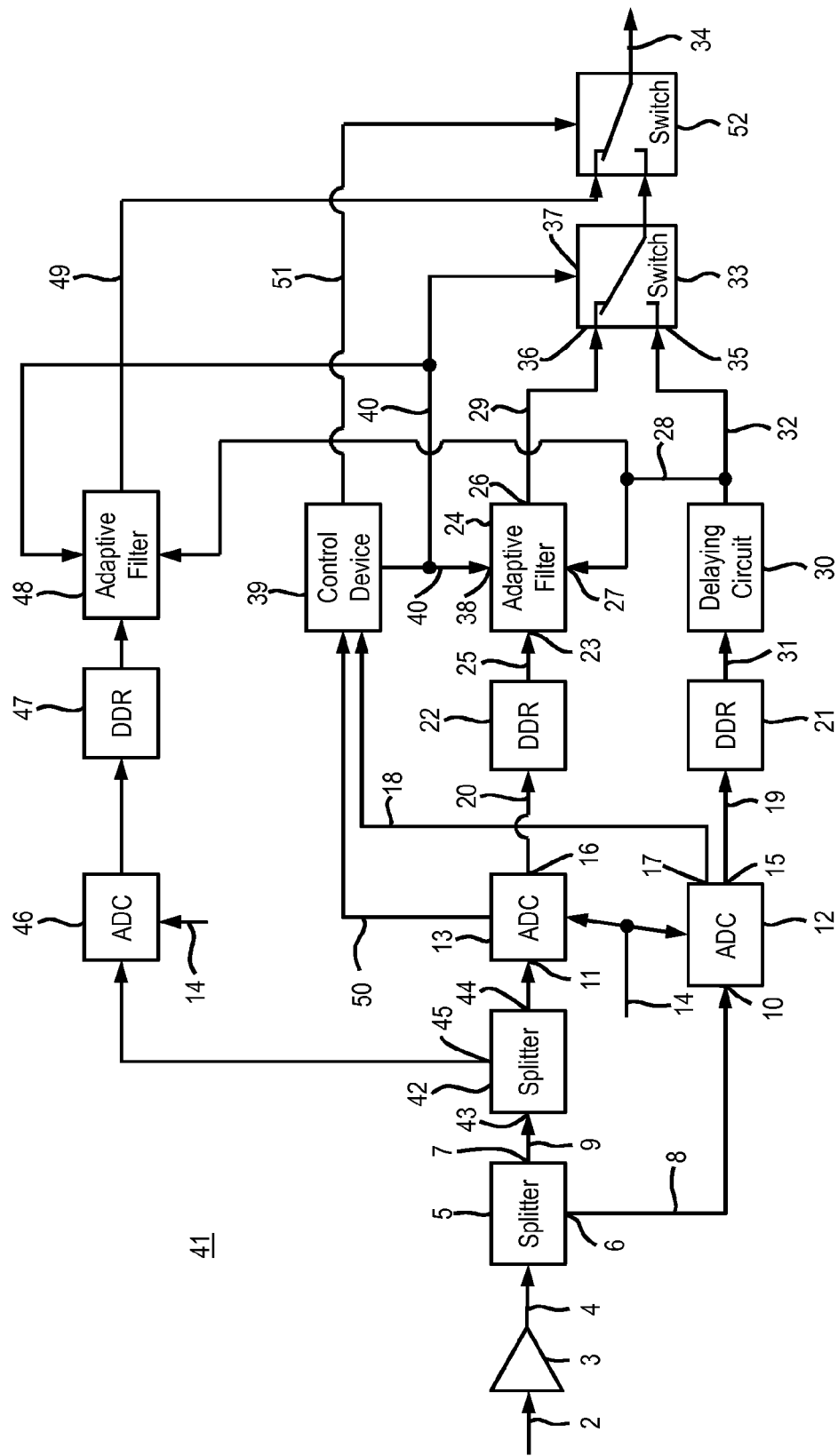
FIG. 2 shows a schematic presentation of a second exemplary embodiment of the device according to the invention for the digitization of data.

FIG. 2 shows a second circuit 41 of a second exemplary embodiment of the invention. The circuit components, which correspond to those of the circuit 1 have been provided with the same reference numbers and the description will not be repeated.

In order further to improve the dynamic, a power fraction (for example 12 dB) is again taken from the second signal branch and supplied to a third power branch. For this purpose, a second power splitter 42 is arranged between the power splitter 5 and the second ADC 13, wherein the second output 7 of the power splitter 5 is now connected to the input 43 of the second power splitter 42. The first output of the second power splitter 42 is the output with the relatively lower attenuation and is connected to the second ADC 13. The second output 45 is the output with the relatively stronger attenuation of 12 dB and is connected to a third ADC 46. Instead of a second power splitter 42, the power splitter 5 with two outputs can be replaced by a power splitter with three outputs. The third ADC 46 digitizes the third signal and outputs it for data reduction to a digital data reducer 47. The third ADC 46 runs time-synchronously with the first two and receives the same clock signal 14.

The decimated, digitized signal is filtered in a second adaptive filter 48 corresponding to the reference signal 28, so that the filtered output signal 49 corresponds to the delayed signal 32 in phase and amplitude. The filter coefficients of the adaptive filter 48 are matched only until the switching signal 40, which signals an overdriven first ADC, arrives at the control input of the adaptive filter 48. The filter coefficients are then fixed, because the reference signal 28 provides the errors of the overdriven first ADC 12.

A switch 52 connects either the output of the switch 33 or the third signal branch to the signal output 34. Here also, as an alternative to the switches 33 and 34, a switch with three switching positions is possible.

If the second ADC 13 now overdrives, a second control signal 50 is output to the control device 39, which outputs a second switching signal 51 for a given time to the switch 52. For the time of the switching signal 51, the third signal branch is connected to the signal output 34.

The invention is not restricted to the exemplary embodiment presented. On the contrary, features of the device according to the invention for the digitization of data can also be combined in an advantageous manner. In particular, both exemplary embodiments may provide only two or three or branches.

The invention claimed is:

1. An apparatus comprising:
   a splitter module configured to split an analog input signal into a first analog signal output on a first signal branch, and a second analog signal output on a second signal branch;
   a first analog/digital converter configured to digitize the first analog signal into a first digital signal;
   a second analog/digital converter configured to digitize the second analog signal into a second digital signal;
   a first switching module configured to switch one of the first signal branch and the second signal branch to an output of the apparatus;
   a first regulating module, disposed between the second analog/digital converter and the first switching module, wherein the first regulating module is configured to adaptively match amplitudes of the second digital signal to amplitudes of the first digital signal; and
   a delay module, disposed between the first analog/digital converter and the first switching module, wherein the delay module is configured to delay the first digital signal by a time corresponding to a processing time of the first regulating module, and wherein the delay module provides the delayed first digital signal as a reference signal to the first regulating module,
   wherein the first regulating module comprises an adaptive filter configured to filter the second digital signal, wherein filter coefficients of the adaptive filter are configured to be matched in a cyclical manner by the reference signal, such that the filtered second digital signal corresponds to the reference signal in phase and amplitude.

2. The apparatus according to claim 1, wherein the first regulating module is further configured in a manner whereby, if the first switching module is set to connect the first signal branch to the output of the apparatus, then the first regulating module matches the amplitudes of the second digital signal to the amplitudes of the first digital signal in an adaptive manner, and, if the first switching module is set to connect the second signal branch to the output of the apparatus, then the first regulating module regulates the amplitudes of the second digital signal in a manner corresponding to matched amplitudes for a previous setting of the first switching module.

3. The apparatus according to claim 1, wherein the configuration of the filter coefficients of the adaptive filter, as being matched in a cyclical manner by the reference signal, is capable of being disabled.

4. The apparatus according to claim 1, further comprising:
   a control module configured to receive a first control signal from the first analog/digital converter, and to generate a first switching signal, wherein the first control signal reflects an overdrive of the first analog/digital converter.

5. The apparatus according to claim 4, wherein the control module provides the first switching signal to a control input of the first switching module.

6. The apparatus according to claim 5, wherein the control module provides the first switching signal to a control input of the first regulating module.

7. The apparatus according to claim 6, wherein the control module outputs the first switching signal upon receipt of the first control signal, wherein the first control signal comprises information that corresponds to an overdriven condition of the first analog/digital converter, and wherein the first switching signal is output for a configurable minimum time.

8. The apparatus according to claim 1, further comprising:
   a comparator module disposed between the first analog/digital converter and the delaying module, wherein the comparator module is configured to generate a first control signal; and
   a control module configured to receive the first control signal from the comparator module, and to generate a first switching signal.

9. The apparatus according to claim 8, wherein the control module provides the first switching signal to a control input of the first switching module.

10. The apparatus according to claim 9, wherein the control module provides the first switching signal to a control input of the first regulating module.

11. The apparatus according to claim 1, wherein the first analog/digital converter and the second analog/digital converter are of a same type, and are synchronized via a common clock source.

12. The apparatus according to claim 1, wherein the splitter module splits the analog input signal into a first power fraction and a second power fraction.

13. The apparatus according to claim 1, further comprising:
   a first digital data reducer disposed between the first analog/digital converter and the delay module; and
   a second digital data reducer disposed between the second analog/digital converter and the first regulating module.

14. The apparatus according to claim 1, wherein initialization values of the first regulating module are one of statically predetermined and dynamically predetermined via a calibration procedure.

15. The apparatus according to claim 1, further comprising:
   a second splitter module configured to split the second analog signal into a split second analog signal and a third analog signal, wherein the second analog/digital converter is configured to digitize the split second analog signal into the second digital signal, and the third analog signal is output on a third signal branch;
   a third analog/digital converter configured to digitize the third analog signal into a third digital signal;
   a second switching module configured to switch one of an output of the first switching module and the third signal branch to the output of the apparatus; and
   a second regulating module, disposed between the third analog/digital converter and the second switching module, wherein the first regulating module is configured to adaptively match amplitudes of the third digital signal to the amplitudes of the first digital signal.

16. The apparatus according to claim 15, wherein the third signal branch is configured in a same ratio to the second signal branch as the second signal branch is to the first signal branch.

17. The apparatus according to claim 15, wherein the delay module further provides the delayed first digital signal as a reference signal to the second regulating module.

18. The apparatus according to claim 15, further comprising:
   a control module configured to,
      receive a first control signal from the first analog/digital converter, and to generate a first switching signal, wherein the first control signal reflects an overdrive of the first analog/digital converter, and
      to receive a second control signal from the second analog/digital converter, and to generate a second switching signal, wherein the second control signal reflects an overdrive of the first analog/digital converter.

19. The apparatus according to claim 18, wherein the control module provides the first switching signal to a control input of the first switching module, and provides the second switching signal to a control input of the second switching module.

20. The apparatus according to claim 19, wherein the control module provides the first switching signal to a control input of the first regulating module and to a control input of the second regulating module.

* * * * *